(12) United States Patent
Schneider et al.

(10) Patent No.: US 9,006,082 B2
(45) Date of Patent: Apr. 14, 2015

(54) FILM TRANSFERABLE LOGIC CIRCUIT, AND METHODS FOR PROVIDING FILM TRANSFERABLE LOGIC CIRCUIT

(71) Applicant: Illinois Tool Works, Inc, Glenview, IL (US)

(72) Inventors: John H. Schneider, Frankfort, IL (US); William A. Herring, Valparaiso, IN (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 13/839,010

(22) Filed: Mar. 15, 2013

(65) Prior Publication Data
US 2014/0264462 A1  Sep. 18, 2014

(51) Int. Cl.
| H01L 21/30 | (2006.01) |
| H01L 29/06 | (2006.01) |
| H01L 25/065 | (2006.01) |
| H01L 23/00 | (2006.01) |

(52) U.S. Cl.
CPC .............. *H01L 25/065* (2013.01); *H01L 24/86* (2013.01)

(58) Field of Classification Search
USPC ................... 438/107, 406, 455; 257/625, 635
See application file for complete search history.

(56) References Cited

U.S. PATENT DOCUMENTS

| 5,638,080 A | 6/1997 | Orthmann et al. |
| 7,289,066 B2 | 10/2007 | Homolle et al. |
| 7,834,818 B2 | 11/2010 | Seemann et al. |
| 8,077,114 B2 | 12/2011 | Lehnberger et al. |
| 8,350,768 B2 | 1/2013 | Peters |
| 2001/0018796 A1 | 9/2001 | Lee et al. |
| 2006/0053286 A1 | 3/2006 | Schaengold |
| 2007/0169960 A1* | 7/2007 | Hayashi ..................... 174/262 |
| 2008/0120835 A1 | 5/2008 | Caletka et al. |
| 2008/0259416 A1 | 10/2008 | Peters et al. |
| 2009/0128445 A1 | 5/2009 | Seemann et al. |

FOREIGN PATENT DOCUMENTS

| DE | 19601358 | 7/1996 |
| DE | 4345473 | 3/2006 |
| EP | 1179811 | 2/2002 |
| EP | 1365451 | 11/2003 |
| EP | 1748382 | 1/2007 |
| WO | WO 03077620 | 9/2003 |
| WO | WO 2006061171 | 6/2006 |

* cited by examiner

*Primary Examiner* — Calvin Lee
(74) *Attorney, Agent, or Firm* — Christopher R. Carroll; The Small Patent Law Group LLC

(57) ABSTRACT

A filmic circuit includes a circuit portion and a carrier layer. The circuit portion includes a logic circuit that includes, for example, plural logic gates configurable to receive an input and provide a corresponding logical output. The carrier layer is configured as a film. The circuit portion is affixed directly to the carrier layer or to an upper coat disposed adjacent to the carrier layer, and the carrier layer is configured to be releasable from the circuit portion after the filmic circuit assembly is affixed to a target. The circuit portion is configured to receive an adhesive layer configured to affix the filmic circuit assembly to the target.

8 Claims, 2 Drawing Sheets

FILM TRANSFERABLE LOGIC CIRCUIT, AND METHODS FOR PROVIDING FILM TRANSFERABLE LOGIC CIRCUIT

BACKGROUND

The subject matter described herein generally relates to filmic circuits and systems and methods for providing filmic circuits.

BRIEF SUMMARY

One or more embodiments described herein provide for a filmic circuit, or film transferable circuit. For example, embodiments provide a filmic circuit assembly including a logic circuit (which may be configured as an IC) that is operably connected with an auxiliary component to form a filmic circuit.

BRIEF DESCRIPTION OF THE DRAWINGS

The present inventive subject matter will be better understood from reading the following description of non-limiting embodiments, with reference to the attached drawings, wherein below.

DETAILED DESCRIPTION

In accordance with one or more embodiments described herein, a filmic circuit assembly and methods for providing a filmic circuit assembly are disclosed. A filmic circuit as used herein may be understood as a circuit formed as a film and/or as part of a film that is film transferable. The filmic, or film transferable, circuit assembly may be configured to be applied to a target. In various embodiments, a filmic circuit may be configured to be applied to a target such as a package or a product. In various embodiments, a filmic circuit may be configured to be applied to a transferable film that is in turn configured to be applied to an object such as a package or product. The film transferable circuit assembly may be, for example, heat transferable.

In various embodiments, the filmic circuit assembly may include a carrier layer configured as a film and a circuit portion that is affixed to the carrier layer. The circuit portion may include, for example, a logic circuit comprising a plurality of transistors, receivers, capacitors, and/or logic gates configurable to receive an input and provide a corresponding logical output. The logic circuit may be configured as an IC component, for example as a thin flexible IC. The circuit portion may also include an auxiliary component, such as a radiofrequency identification (RFID) antenna that is operably connected to the IC component to form a filmic circuit. The auxiliary component may be under the control of the IC component. The carrier layer may be configured to be releasable or otherwise removable from the circuit portion after application of the filmic circuit assembly to a target. In various embodiments, a filmic circuit assembly may include a carrier layer (which may have associated therewith a release layer) and a filmic circuit including an IC component, and be substantially devoid of other layers or portions. Further, such a filmic circuit assembly may also include or have associated therewith an adhesive layer.

In various embodiments, a filmic circuit assembly may include an adhesive layer configured to affix the filmic circuit assembly to a target. For example, the circuit portion may receive the adhesive layer before affixation to the target. In various embodiments, an adhesive layer may be part of a target, with the circuit portion attached to the adhesive layer as part of the filmic circuit assembly being applied to the target, or, as another example, an adhesive layer may be placed or positioned between the filmic circuit assembly and the target at or near application of the filmic circuit assembly to the target.

In various embodiments, all or a portion of the circuit assembly may be mounted, applied, formed, or otherwise added to the carrier layer directly. Additionally or alternatively, all or a portion of the logic circuit assembly may be mounted, applied, formed, or otherwise added to the carrier layer indirectly, for example by being added to a layer such as an upper coat that is in turn affixed either directly or indirectly to the carrier layer. In some embodiments, all or a portion of the filmic circuit assembly may be pre-programmed before being added to the carrier layer. Alternatively or additionally, all or a portion of the filmic circuit assembly may be programmed after being added to the carrier layer.

As mentioned above, an IC component may be coupled or otherwise operably connected with additional components as part of a circuit. Such an IC component may include a logic circuit and may be formed as thin flexible IC, for example as a screen printed circuit on a flexible substrate, such as a polyester or similar film. As used herein, a logic circuit may be understood as a circuit including one or more of transistors, capacitors, resistors, or logic gates, with the logic gates configured to perform logical operations on one or more logic inputs and produce corresponding logic outputs. A circuit portion, as used herein, may be understood as including an IC component coupled or otherwise operatively connected to one or more other components (referred to herein as auxiliary components) that provide functionality. In some embodiments, one or more auxiliary components may be understood as providing input/output (I/O) functionality to a circuit including an IC component. For example, a RFID antenna may be provided as an auxiliary component operably connected to and under the control of an IC component, with the IC component configured to communicate with outside resources via the RFID antenna. As another example, a battery may be provided as a power input to the IC component. As still another example, a light and/or display screen may be provided as a visual output for the IC component. As still yet another example, a speaker may be provided to provide audio output from the IC component.

For example, a circuit portion may include an IC component including logic configured to identify one or more of the IC component (or circuit including the IC component), a film within which the IC component is embedded, or an object associated therewith, along with a radiofrequency identification (RFID) antenna. An operator or other observer may be able to acquire identification information corresponding to the IC component, film, and/or associated object from the circuit portion via the RFID antenna. Thus, an operator may be provided with a reliable and convenient way to identify an object (e.g., an object to which a transferable film including an IC component operably connected to an RFID antenna has been applied). In various embodiments, information from the IC component (or logic circuit) may be acquired using near field communication (NFC) devices and/or protocols.

Use of a filmic IC for identification provides just one example of potential types of filmic IC's or uses for filmic IC's. For example, filmic IC's may be employed to provide improved interactivity between an operator and one or more of a transferable film including the filmic IC or a product or package associated with the filmic IC. Embodiments provide for cost effective, convenient, and/or reliable forming of an IC as a filmic IC. Embodiments provide for flexibility, functionality, and/or performance of various targets (e.g., a transferable film to which a filmic IC may be applied or added) by the addition, incorporation, or embedment of a logic circuit to the transferable film. For example, embodiments provide for a label that may be heat transferable to a package or product that provides for improved readability or other acquisition of identification information. Identification information, for example may be acquired more quickly, more reliably, or the like. Various embodiments may provide for convenient mounting of a logic circuit to products, packages, or surfaces thereof having round, curved, angled, uneven, irregular, or otherwise contoured portions.

Figure 1:
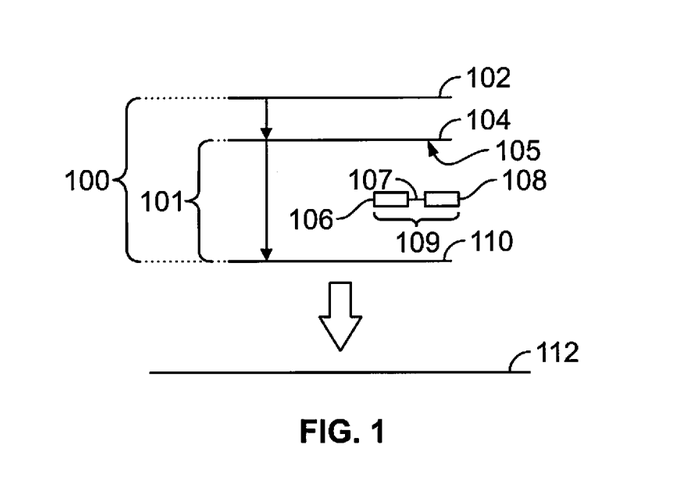
FIG. 1 is a schematic view of one embodiment of a filmic circuit assembly.

FIG. 1 shows a schematic view of a filmic circuit assembly 100 that may be applied or affixed to a target 112. Generally, in the depicted embodiment, the filmic circuit assembly 100 includes a carrier layer 102, an upper coat 104, an IC component 106, an auxiliary component module 108, and an adhesive layer 110. The IC component 106 and the auxiliary component module 108 in the illustrated embodiment are operably coupled to each other to form a circuit portion 109. The depicted filmic circuit assembly 100 may be configured to be transferable (e.g., heat transferable) to the target 112. The target 112, for example, may be a transferable film configured to incorporate the filmic circuit assembly 100 along with additional layers, components, or aspects such as graphics, optically readable identification codes, protective layers or coats, or the like. The filmic circuit assembly 100 may be understood as including an affixation portion 101 and the carrier layer 102. The carrier layer 102 may be understood as a removable portion of the filmic circuit assembly 100. For example, after the filmic circuit assembly 100 is affixed to a target, the carrier layer 102 may be removed, with the affixation portion 101 remaining affixed to the target.

The transferable film may be configured to be applied to an object, such as a box, package, envelope, container, sheet, or the like. Alternatively or additionally, the filmic circuit assembly 100 may be configured to be directly applied to an object, such as a box, package, envelope, container, sheet, or the like. The carrier layer 102 in the illustrated embodiment is configured to be releasable or removable from the filmic circuit assembly 100 upon application of the filmic circuit assembly 100 to a target. The adhesive layer 110 is configured to be oriented toward a target (e.g., target 112) receiving the filmic circuit assembly 100 and to be positioned adjacent to the target (and interposed between the target 112 and the filmic circuit assembly 100) after application of the filmic circuit assembly 100. The adhesive layer 110 is configured to adhere the circuit portion 109 to the target 112 receiving the filmic circuit assembly 100. The circuit portion 109, for example, as also indicated above, may include an IC component (or logic circuit) operably connected with one or more additional components, such as an RFID antenna. Upon, during, or after application of the filmic circuit assembly 100 to a desired target object, the carrier layer 102 may be released or removed from the filmic circuit assembly 100, leaving the circuit portion 109 (e.g., the IC component 106, the auxiliary component module 108, and any additional related components or aspects such as interconnecting traces coupling the IC component 106 and the auxiliary component module 108) adhered or otherwise joined to the target 112. Thus, the filmic circuit assembly 100 (e.g., the affixation portion 101 of the filmic circuit assembly 100) may be understood as being transferred from the carrier layer 102 to the target 112. The filmic circuit assembly 100 may be configured to be flexible, and may be mounted to products, packages, or surfaces thereof having round, curved, angled, uneven, irregular, or otherwise contoured portions.

It should be noted that FIG. 1 (nor other Figures described herein) is not intended as a scale representation. Instead, FIG. 1 (and other Figures described herein) are intended as schematic in nature and for clarity of understanding of general principles of various embodiments. For example, layers, coatings and/or portions may vary in thickness or number, different layers may have different thicknesses than other layers, one or more layers may include sub-layers, one or more layers may be combined, one or more layers may be split into separate layers, or the like. Further, various layers may provide differing areas of coverage. For example, a given layer may not cover an entire area covered by a different layer. In some embodiments, one or more layers or portions may be disposed at a same or similar depth in the filmic circuit assembly 100, such that given layers may have partially or completely overlapping depths along the thickness of the filmic circuit assembly 100. Further still, in various embodiments, certain layers or portions depicted in FIG. 1 may not be included, and/or additional layers or sub-layers may be provided. By way of example only, in various embodiments, a filmic circuit assembly may not include an adhesive layer. For example, an adhesive may be provided as part of a target to which a filmic circuit assembly is affixed.

The carrier layer 102 may be configured to receive one or more additional layers, portions, or aspects, directly or indirectly. In the illustrated embodiment, the carrier layer 102 is configured to be releasable from the circuit portion 109 temporally proximate to an application of the filmic circuit assembly 100 to a target. For example, the carrier layer 102 may be released from the filmic circuit assembly 100 via a specified application of heat. Thus, the filmic circuit assembly 100 may be considered as being transferred from the carrier layer 102 to the target 112. Temporally proximate may be understood as meaning, for example, at or near in time. For example, the release of the carrier layer 102 may overlap in time with the application of the filmic circuit assembly 100 to a target, or as another example, may occur shortly thereafter. The carrier layer 102 is configured to provide a substrate for construction of the filmic circuit assembly 100, with additional layers, sub-layers or portions affixed to the carrier layer 102 directly, and/or affixed to the carrier layer indirectly by being affixed to a layer or sub-layer that has already been affixed to the carrier layer 102 (e.g., upper coat 104). The carrier layer 102 may be configured as a film. The carrier layer 102 may be made from, for example, a polymeric film. For example, a polyethylene terapththalate (PET) such as biaxially-oriented polyethylene terephthalate (BoPET) may be used. BoPET may be understood as a polyester film made from stretched PET.

In the embodiment depicted in FIG. 1, the filmic circuit assembly 100 includes an upper coat 104 disposed adjacent to and immediately beneath (e.g., closer to the circuit portion 109 and/or to a target to which the filmic circuit assembly 100 is to be affixed) the carrier layer 102. Thus, in the illustrated embodiment, the upper coat 104 is interposed between the carrier layer 102 and all or a portion of the circuit portion 109 (e.g., interposed between the carrier layer 102 and one more of the IC component 106 and the auxiliary component module 108). The upper coat 104 may be comprised of a single layer or plural sub-layers. The upper coat 104 may be configured to provide protection for aspects of the filmic circuit assembly 100 disposed beneath the upper coat 104 (e.g., circuit portion 109); to provide a smooth or planarized surface for mounting of one or more aspects of the circuit portion 109; and/or to provide for releasability from the carrier layer 102.

For example, the upper coat 104 of the illustrated embodiment is configured to facilitate the release of the carrier layer 102 from the filmic circuit assembly 100 under specific conditions (e.g., a given amount of heat and/or duration of time of heat application). For example, the upper coat 104 may include a release layer or sublayer oriented toward the carrier layer 102 and disposed immediately adjacent to the carrier layer 102. The release layer or aspect of the upper coat 104 may be configured to facilitate the removal of the carrier layer 102 from the affixation portion 101 after the filmic circuit assembly 100 has been applied to an object (e.g., target 112). The upper coat 104, for example, may include one or more layers or sublayers made from an acrylic or other polymer. In some embodiments, when the carrier layer 102 is removed, all or a portion of a release layer or sublayer of the upper coat 104 may be removed with the carrier layer 102. In some embodiments, when the carrier layer 102 is removed, all or a portion of a release layer or sublayer may remain with the affixation portion 101.

In various embodiments a surface 105 of the upper coat 104 may be planarized, or processed to provide a substantially planar surface. The surface 105 in the illustrated embodiment is the surface of the upper coat 104 oriented toward the circuit portion 109 (e.g., the surface of the upper coat 104 most distant from the carrier layer 102). The surface 105 of the upper coat 104 may be planarized to provide a high level of smoothness. Such a planarized surface may provide for improved ease of application of the circuit portion 109 (e.g., IC component 106 and/or auxiliary component module 108) and/or improved reliability of the circuit portion 109. Alternatively or additionally, the carrier layer 102 may be planarized. For example, in embodiments where all or a portion of the IC component 106 is applied directly to the carrier layer 102 (e.g., by printing the IC component 106 directly on the carrier layer 102), the carrier layer 102 may be planarized. In the embodiment depicted in FIG. 1 a surface of the upper coat 104 (e.g., the surface of the upper coat 104 oriented toward the circuit portion 109) has been planarized to provide a planarized surface 105 configured to receive the circuit portion 109.

Further, in the illustrated embodiment, the upper coat 104 is configured to provide protection to aspects of the filmic circuit assembly 100 disposed beneath the upper coat 104 (e.g., circuit portion 109). The upper coat 104 may be configured to have a thickness large enough to protect, for example, the circuit portion 109. For example, the upper coat 104 may include a protective layer or sublayer that may be relatively thicker than a release layer or sublayer. In various embodiments, the upper coat 104 may be configured as a single homogenous layer configured to provide for the releasability, planarization, and protection. In other embodiments, the upper coat 104 may be configured including distinct sub-layers. In still other embodiments, the upper coat 104 may be configured to omit one or more of the above discussed aspects. For example, the upper coat 104 in some embodiments may be configured as a relatively thin release coat having a planarized surface (e.g., via spin casting) oriented toward the circuit portion 109, with the circuit portion 109 applied to the relatively thin release coat.

In the illustrated embodiment, the IC component 106 is depicted as being applied to the upper coat 104. Thus, the IC component 106 may be understood as being indirectly affixed or applied to the carrier layer 102 in the embodiment depicted in FIG. 1. Alternatively or additionally, all or a portion of the IC component 106 may be applied directly (e.g., with no intervening or interposed layer or material) to the carrier layer 102.

The IC component 106 as shown in FIG. 1 is positioned beneath (e.g., closer to the target 112 or farther from the view of an observer of the target 112) than the upper coat 104 to which the IC component 106 is applied, as well as the carrier layer 102. It should be noted that all or a portion of the IC component 106 may be formed or applied as one or more layers or sub-layers. For example, the IC component 106 may include individual circuits or sub-circuits formed on different layers or sub-layers that are coupled to each other or otherwise operably connected. In some embodiments, the various layers or sub-layers may be applied sequentially to already present portions of the filmic circuit assembly 100 that have been applied directly or indirectly to the carrier layer 102, such as the upper coat 104 and/or previously applied layers or sub-layers of a logic circuit. Alternatively or additionally, various layers or sub-layers of the IC component 106 may first be joined together to form a sub-assembly which is subsequently added to already present portions of the filmic circuit assembly 100, such as the carrier layer 102 and/or the upper coat 104. The IC component 106 may be associated with the auxiliary component module 108 to form the circuit portion 109 that includes a logic circuit (e.g., IC component 106) operably coupled to one or more additional components, such as an RFID antenna. In various embodiments, the IC component 106 may be configured to communicate with an observer utilizing near field communication (NFC) devices and/or protocols. In various embodiments, the IC component 106 (and/or one or more aspects of an integrated circuit) may be configured as a thin flexible circuit.

The IC component 106 may comprise, for example, transistors, capacitors, resistors, and logic gates configurable to receive an input and provide a corresponding logical output. The IC component 106 may be configured as a thin, flexible IC. In various embodiments, the IC component 106 may be provided or added to the upper coat 104 (or other aspect of the filmic circuit assembly 100) as a unit (or as one or more operably connected units). Such a logic circuit may be pre-programmed (e.g., programmed before addition to the filmic circuit assembly 100), or may be programmed after addition to the filmic circuit assembly 100. In various embodiments, the logic circuit 100 may be partially pre-programmed, and partially programmed after addition to the filmic circuit assembly 100.

In various embodiments, the IC component 106 may be added to the filmic circuit assembly 100 via the addition of material (e.g., non-conductive and one or more of conductive or semi-conductive materials) applied, for example, in a sequence. For example, the IC component 106 may be added via printing to one or more of the upper coat 104 or the carrier layer 102. In various embodiments, non-conductive and semi-conductive materials may be added to a surface (e.g., planarized surface 105 of the upper coat 104) and imprinted in a manner to form a logic circuit.

In some embodiments, the IC component 106 may be configured to store, update, and/or communicate identification and/or tracking information regarding one or more of the IC component 106, the auxiliary component module 108, the filmic circuit assembly 100, or the target 112 (or an object associated with the target 112). Additionally or alternatively, the IC component 106 may be configured for virtually any functionality that may be provided by a logic circuit or integrated circuit within the size, expense, and power constraints imposed by a given application and/or size or thickness constraints of the film housing or associated with the filmic circuit assembly 100.

In various embodiments, the IC component 106 may be programmed or otherwise configured before being applied or added to the filmic circuit assembly 100. Alternatively or additionally, the IC component 106 may be programmed or otherwise configured after being applied or added to the filmic circuit assembly. For example, in some embodiments, the IC component 106 may be applied (e.g., imprinted upon the surface 105 of the upper coat 104) so that the IC component 106 includes no connections. Then, semi-conductive material of the IC component 106 may be digitally laser modified to form conductive connections to program in a serial or tracking number that can be later read. As another example, the IC component 106 may be imprinted so that all conductive connections are made. Then, conductive material of the logic circuit may be digitally laser modified to eliminate certain connections between predetermined paths to produce distinct serial or tracking numbers. In various embodiments, programming may occur via digitally printing distinct conductive interconnects for each circuit using conductive inks. In some embodiments, programming of a filmic circuit assembly may be begun and/or completed by a manufacturer or supplier of a filmic circuit assembly. In various embodiments, programming of an integrated circuit or logic circuit may be completed by a purchaser or user of a filmic circuit assembly, for example prior to applying a transferable film (e.g., a transferable film which includes or incorporates the filmic circuit assembly 100) to an object being decorated or otherwise labeled. Thus, in various embodiments, the IC component 106 may be programmed one or more of before, during, or after the fabrication, manufacture, or assembly of the filmic circuit assembly 100. For example, in some embodiments, the IC component 106 may be programmed at any time prior to the addition of an adhesive layer to the circuit portion 109.

As also indicated above, the IC component 106 may be formed from one or more layers that are operably connected. Further, the IC component 106 and the auxiliary component module 108 may be formed in a common layer or at a generally overlapping common depth along the thickness of the filmic circuit assembly 100. For example, as shown in FIG. 1, the IC component 106 and the auxiliary component module 108 are shown positioned at substantially the same depth. In other embodiments, however, all or a portion of the IC component 106 may be positioned at a different depth than all or a portion of the auxiliary component module 108. In some embodiments, the IC component 106 and the auxiliary component module 108 may be added to the filmic circuit assembly 100 as a pre-assembled unit, while in other embodiments, the IC component 106 may be added separately from the auxiliary component module 108. For example, the IC component 106 may be added to the filmic circuit assembly 100 before the auxiliary component module 108 is added to the filmic circuit assembly 100, while in other embodiments the auxiliary component module 108 may be added before the IC component 106. In still other embodiments, the IC component 106 and/or the auxiliary component module 108 may be added to the filmic circuit assembly 100 in discrete steps, with one or more steps of adding the IC component 106 overlapping in time with one or more steps of adding the auxiliary component module 108. In some embodiments, the IC component 106 and the auxiliary component module 108 may be positioned generally adjacent or lateral to each other as shown in FIG. 1, while in other embodiments, all or a portion of the IC component 106 and the auxiliary component module 108 may be stacked relative to each other along the depth of the filmic circuit assembly 100.

The auxiliary component module 108 may be configured to include one or more auxiliary components (e.g., RFID antenna, display, light, speaker, battery, or the like), with the one or more auxiliary components configured to be coupled or operatively connected to the IC component 106, with the IC component 106 configured to control the one or more auxiliary components to provide a desired functionality to the circuit portion 109 including the IC component 106. For example, the auxiliary component module 108 may include an RFID antenna that is registered to or otherwise associated with the IC component 106. Additionally or alternatively, other auxiliary modules may be employed, based on the desired functionality of the filmic circuit assembly 100.

The circuit portion 109 may include one or more connections 107, with the auxiliary component module 108 in the illustrated embodiment operably connected with the IC component 106 by the connection 107 to form the circuit portion 109. The auxiliary component module 108 and the IC component 106 may be operably coupled by various techniques in various embodiments. For example, in some embodiments, the connection 107 may include interconnecting conductive traces. For example, interconnecting conductive traces may be printed in various embodiments as a fixed print or as a digital print. Such printed traces may be printed, for example, to the planarized surface 105 of the upper coat 104. In various embodiments, interconnecting traces may be provided as a pre-supplied portion of a IC component 106 to be added to the filmic circuit assembly 100. Alternatively or additionally, interconnecting traces may be provided as a pre-supplied portion of an auxiliary component module 108. In various embodiments, the interconnects of a IC component 106 may be affixed with a conductive adhesive to an auxiliary component module 108 such as an RFID antenna. For example, an epoxy, such as a silver-filled thermal set epoxy may be employed in some embodiments. An epoxy may be applied, for example, via droplets provided by a syringe. Alternatively or additionally, interconnects of an auxiliary component module 108 may be affixed with a conductive adhesive to a IC component 106.

In the illustrated embodiment, the filmic circuit assembly 100 includes an adhesive layer 110. In various embodiments, the adhesive layer 110 may be added or applied to one or more of the upper coat 104, the IC component 106, or the auxiliary component module 108. In some embodiments, the adhesive layer 110 may be applied after programming the IC component 106.

In the illustrated embodiment, the adhesive layer 110 is the portion of the filmic circuit assembly 100 positioned most proximately to the target 112 when the filmic circuit assembly 100 is applied to the target 112. The adhesive layer 110 may be configured to affix, secure, mount, or otherwise adhere the filmic circuit assembly to the target 112, and to maintain the filmic circuit assembly adhered to the target 112 when the carrier layer 102 is removed from the filmic circuit assembly 100. For example, after the filmic circuit assembly 100 is applied to the target 112, the carrier layer 102 (along with the upper coat 104) may be removed (e.g., via a heat release mechanism), with the remaining portions of the filmic circuit assembly 100 such as the circuit portion 109 remaining affixed to the target 112.

In some embodiments, the adhesive layer 110 may be added to the filmic circuit assembly 100 at or about the same time as the other portions of the filmic circuit assembly 100 are added (e.g. as part of a generally continuous line or process). In some embodiments, an adhesive layer 110 may be added to the filmic circuit assembly 100 at a different time or location (e.g., a different facility such as a facility of a customer that has acquired the filmic circuit assembly 100 from a supplier). For example, the adhesive layer 110 (or an additional adhesive layer) may be applied to the filmic circuit assembly 100 shortly before the filmic circuit assembly 100 is applied to the target 112. In still other embodiments, the filmic circuit assembly 100 may not include an adhesive layer. For example, an adhesive layer may be provided on a surface of the target 112 to which the filmic circuit assembly 100 is applied. As another example, a separate adhesive layer may be positioned between the filmic circuit assembly 100 and the target 112 when the filmic circuit assembly 100 is affixed to the target 112.

In various embodiments, the target 112 may be a transferable film configured to receive or otherwise incorporate the filmic circuit assembly 100, with the transferable film in turn configured to be applied (e.g., via a heat transfer) to an object such as a package or product. The transferable film that receives the target may include additional layers or aspects such as graphics, protective coatings, additional adhesive layers, or the like. In some embodiments, the transferable film that receives the filmic circuit assembly 100 may be a heat transferable film. In various embodiments, the transferable film that receives the filmic circuit assembly 100 may be configured as a hot stamping foil. In still other embodiments, the target 112 may be an object such as a package or a product.

Generally, the filmic circuit assembly 100 may be assembled by adding the circuit portion 109 to the carrier layer 102 either directly or indirectly. The filmic circuit assembly 100 may then be positioned as desired relative to the target 112 (e.g., at a desired location along a surface of the target 112 with the carrier layer 102 oriented away from the target 112). When the filmic circuit assembly 100 is in place on the target 112, the carrier layer 102 may be removed (e.g., via application of a prescribed amount and/or duration of heat) so that the carrier layer 102 is removed from the filmic circuit assembly 100. The filmic circuit assembly 100 (e.g., the affixation portion 101 including the circuit portion 109) may then be left remaining with the target 112. Thus, the carrier layer 102 (may be considered as a temporary portion of the filmic circuit assembly 100, in that the filmic circuit assembly 100 may be completely formed and include the carrier layer 102 (e.g., before application to a target), or may be completely formed and not include the carrier layer 102 (e.g., after the filmic circuit assembly 100 has been applied to a target and the carrier layer 102 released or otherwise removed). Other aspects of the filmic circuit assembly 100 (e.g., the IC component 106, auxiliary component module 108, associated interconnecting traces, or the like) may be considered permanent portions of the filmic circuit assembly 100, as the filmic circuit assembly 100 may not be considered completely formed without such permanent portions.

Thus, various embodiments provide a film transferable circuit assembly that may be applied directly to an object such as a package or product, or may be incorporated into a transferable film which is in turn configured to be applied to a package or product. A film transferable circuit may be provided by various embodiments for convenient transfer to a target. Embodiments provide for the cost effective mounting of an integrated circuit to a package or product. Embodiments provide for flexibility, functionality, and/or performance of transferable films by the addition, incorporation, or embedment of a film transferable circuit to the transferable film. For example, identification information may be acquired more quickly, more reliably, or the like.

Figure 2:
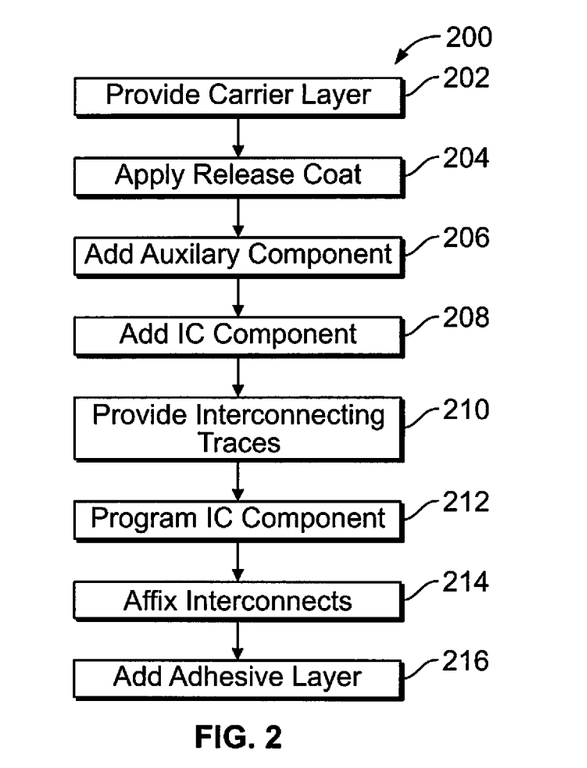
FIG. 2 is a flowchart of one embodiment of a method for providing a filmic circuit assembly.

FIG. 2 is a flowchart of a method 200 for providing a filmic circuit assembly. The method 200 may be used in conjunction, for example, with one or more embodiments described herein, and/or used to provide a filmic circuit assembly such as filmic circuit assembly 100 shown in FIG. 1 and described herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. Generally, the method 200 includes the provision or acquisition of a carrier layer (e.g., carrier layer 102), and the addition thereto of a circuit portion (e.g., circuit portion 109). In various embodiments, a release coat and/or an adhesive layer may also be employed. In various embodiments, a portion or layer may be provided in one or more steps (e.g., a circuit portion may be added by sequentially adding an IC component and one or more auxiliary components; a logic circuit or IC component may be added by adding one or more materials and further processing materials once added). Further, one or more layers or other aspects may be formed into a subassembly and then added to other assemblies or subassemblies. By way of example and not limitation, in various embodiments, all or a portion of the circuit portion may be formed as a whole or as a unit before application to a carrier layer or to another layer directly or indirectly joined or affixed to the carrier layer, such as a release layer. The filmic circuit assembly may be formed in one or more locations. For example, in some embodiments, the filmic circuit assembly may be constructed or assembled in a first location or locations without the adhesive layer configured to be closest to a target to which the filmic circuit assembly is configured to be applied, with the adhesive layer being joined or added to the filmic circuit assembly at or near the time of application of the filmic circuit assembly to the target. In some embodiments, various layers may be applied by coating, printing, application as a film or foil, or the like.

At 202, a carrier layer or film (e.g., carrier layer 102) is provided. The carrier layer or film may be constructed, for example, from a polymeric film, such as a PET film or a BoPET film. The carrier layer may be configured to provide a substrate to which additional layers or portions of the filmic circuit assembly are mounted or affixed directly or indirectly. The carrier layer may also be configured to be releaseable or otherwise removable from the filmic circuit assembly after the filmic circuit assembly is affixed to a target, such as a heat transfer film or hot stamping foil. For example, the carrier layer may be released from the filmic circuit assembly as part of a heat transfer through the application of a specific amount of heat and/or duration of heat application.

At 204, a release coat (e.g., a release coat configured as at least a portion of upper coat 104) may be applied to the carrier layer. In some embodiments, an upper coat including a release layer oriented toward the carrier layer may be applied in one or more steps to the carrier layer. In various embodiments, the release coat may be coated onto one side of the carrier film (e.g., the side of the carrier film that will be oriented toward the logic circuit portion and the target to which the filmic circuit assembly will be affixed or applied). The release coat may be configured to have release properties to assist in the release or removal of the carrier film. In some embodiments, the release coat may be omitted and/or incorporated or otherwise included in the carrier layer. In still other embodiments, the release coat may be incorporated or otherwise included in an upper coat disposed adjacent to the carrier layer (e.g., upper coat 104).

At 206, an auxiliary component is added to the filmic circuit assembly. In various embodiments, the auxiliary component may be affixed to the upper coat. Thus, the auxiliary component may be indirectly affixed to the carrier layer by being affixed to the upper coat which is in turn affixed to the carrier layer. As one example, the auxiliary component may be a RFID antenna. In various embodiments, alternative or additional auxiliary components may be added. In various embodiments, one or more auxiliary components may be affixed or otherwise adhered directly to the carrier layer. In some embodiments, an auxiliary component, such as a RFID antenna, may be supplied as a unit and placed and affixed to the release coat layer. Additionally or alternatively, an auxiliary component such as a RFID antenna may be printed onto the upper coat (and/or the carrier coat).

At 208, a logic circuit (e.g., IC component 106) is added to the filmic circuit assembly. The logic circuit, for example, may include a plurality of transistors, resistors, capacitors, and logic gates configurable to provide a logical output in response to one or more inputs. In some embodiments, the logic gates may be pre-configured before being added to the filmic circuit assembly. The logic circuit may be added to the filmic circuit assembly, for example, providing a logic circuit, registering the logic circuit to an auxiliary component (e.g., the auxiliary component such as RFID antenna added at 206), and adhering the logic circuit to the release coat. In some embodiments, the logic circuit may be added as a whole or unit to the filmic circuit assembly, while in other embodiments, the logic circuit may be added in fractional portions. The logic circuit in some embodiments may be affixed directly to the carrier layer, while in other embodiments the logic circuit may be affixed indirectly to the carrier (e.g., via affixation to the upper coat).

At 210, interconnecting traces are provided. The interconnecting traces are configured to connect the logic circuit to the auxiliary component (e.g., RFID antenna) so that the logic circuit and auxiliary component may form a functioning circuit portion. In various embodiments, some or all of the interconnecting traces may be provided and added to the filmic circuit assembly one or more of with the logic circuit, with the auxiliary component, or separately from the logic circuit and auxiliary component. In various embodiments, interconnecting traces (or interconnects) may be printed either as a fixed print or as a digital print. For example, interconnects may be printed directly to one or more of the carrier layer or the release coat. In various embodiments, interconnects may be pre-supplied as part of a logic circuit and/or as part of an IC component or module.

At 212, the logic circuit may be programmed. It should be noted that this programming may be performed at a variety of times (or, in some embodiments, not at all). In some embodiments, the logic circuit may be provided as a pre-programmed unit. In some embodiments, the logic circuit may be partially or entirely programmed during the assembly or manufacture of the filmic circuit assembly. In some embodiments, the logic circuit may be programmed after the filmic circuit has been assembled or manufactured, for example the logic circuit may be programmed by a customer or other user that has acquired an assembled or manufactured filmic circuit assembly. In various embodiments, the programming of the logic circuit may assign one or more serial number, tracking number, or other identifier to the logic circuit that may be read, for example, by a RFID reader or a NFC device. In various embodiments, additional or alternative programming may be performed as appropriate for a given application.

The programming of the logic circuit may be accomplished by one or more of a variety of techniques. By way of example only and not limitation, in some embodiments, the logic circuit may be added to a layer or coat of the filmic circuit assembly without connections. Then, semi-conductive material of the logic circuit may be digitally laser modified to form conductive connections to program the logic circuit. As another example, the logic circuit may be initially formed with all conductive connections made. Then, conductive material of the logic circuit may be digitally laser modified to eliminate certain connections between predetermined paths to program the logic circuit. As one more example, programming may occur via digitally printing distinct conductive interconnects for each circuit using conductive inks.

At 214, the interconnects joining, coupling, or operatively connecting the logic circuit and the auxiliary component (e.g., RFID antenna) are completed or finished, for example via affixation with a conductive adhesive. It should be noted that such interconnects may be completed or finished at various times or places during the performance of methods in various embodiments. For example, the interconnects may be completed or finished before the logic circuit and auxiliary component are added to the filmic circuit assembly, for example in embodiments where the logic circuit and auxiliary component are added to the filmic circuit assembly as a pre-formed assembly. As another example, in some embodiments, the interconnects may be completed or finished before programming the logic circuit, while in other embodiments, the interconnects may be completed or finished after programming the logic circuit.

At 216, an adhesive layer (e.g., adhesive layer 110) is added to the filmic circuit assembly. In some embodiments the adhesive layer may be applied to one or more portions of the filmic circuit assembly, such as a circuit portion (e.g., circuit portion 109). The adhesive layer is configured to adhere the filmic circuit assembly to a target, and may be applied to one or more surfaces, layers, or portions of the filmic circuit assembly that are configured to be positioned most proximate the target when the filmic circuit assembly is affixed to the target. In some embodiments, the target may be a transferable film or foil being assembled, such as a heat transfer film or a hot stamping foil. In various embodiments, the target may be an object such as a product or package. The adhesive layer may be applied, for example, by coating a layer of adhesive over the logic circuit portion. In some embodiments, an adhesive layer may not be added to the filmic circuit assembly, but instead be provided as a part of the target. For example, a film or a foil being assembled or manufactured may have an adhesive layer configured to receive the filmic circuit assembly.

Figure 3:
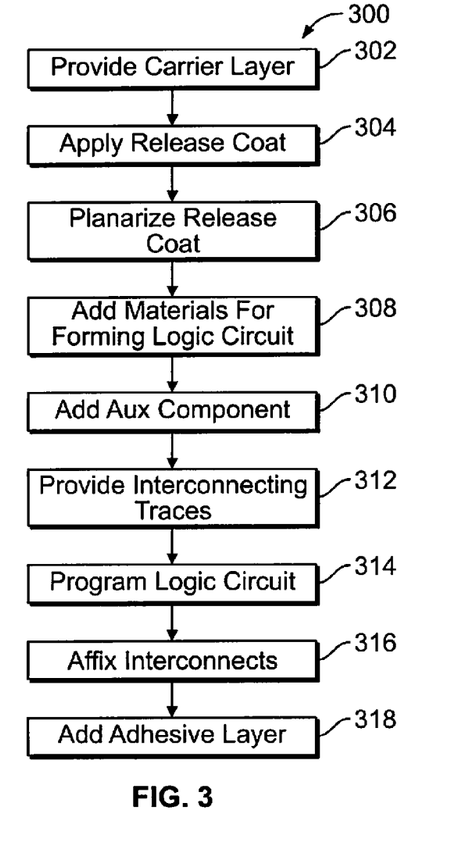
FIG. 3 is a flowchart of an additional embodiment of a method for providing a filmic circuit assembly.

FIG. 3 is a flowchart of one embodiment of a method for providing a filmic circuit assembly. The method 300 may be used in conjunction, for example, with one or more embodiments described herein. For example, one or more aspects or steps of the method 200 may be combined with one or more aspects or steps of the method 300 in various embodiments. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. Generally, the method 300, which may be similar in respects to the method 200, includes the provision or acquisition of a carrier layer, and the addition thereto of a circuit portion.

At 302, a carrier layer or film is provided. The carrier layer or film may be provided similarly in respects to the provision of a carrier layer discussed in connection with step 202 of the method 200. For example, the carrier layer may be configured to provide a substrate to which additional layers or portions of the filmic circuit assembly are mounted or affixed and to be releaseable or otherwise removable from the filmic circuit assembly after the filmic circuit assembly is affixed to a target.

At 304, a release coat may be applied to the carrier layer. The provision of the release coat may be similar in respects to the provision of a release coat discussed in connection with step 204 of the method 200. For example, the release coat may be coated onto one side of the carrier film and may be configured to have release properties to assist in the release or removal of the carrier film. As another example, in some embodiments, the release coat may be provided as a portion of an upper coat (e.g., upper coat 204). In some embodiments, the release coat may be omitted and/or incorporated or otherwise included in the carrier layer.

At 306, the release coat (or other surface to which materials for constructing a logic circuit are to be applied) is planarized. For example, a surface of the release coat (or upper coat) that will receive one or more aspects of a logic circuit portion (e.g., surface 105) may be planarized, for example to provide a high level of smoothness and/or planarity. Such a planarized surface may provide for improved ease of application of a logic circuit and/or auxiliary module, and/or improved reliability of the logic circuit and/or auxiliary module that has been mounted, printed, or otherwise affixed to a planarized surface. Alternatively or additionally, the carrier layer 102 may be planarized, for example in embodiments where the carrier layer may receive one or more aspects of a logic circuit portion.

At 308, materials for constructing, configuring, providing, or otherwise forming a logic circuit (or IC Component) are added to the filmic circuit assembly, for example to a surface that has been planarized at 306. For example, materials may be printed to a surface of the filmic circuit assembly. In some embodiments, the materials added to the filmic circuit assembly may include non-conductive as well as semi-conductive materials. The materials may be imprinted to form a logic circuit, for example a logic circuit including plural gates that are configured, or may be configured at a future time, to provide one or more logical outputs in response to one or more received inputs. The logic circuit may configured with some connections made between various gates or other aspects, with all connections made, or with no connections made. For example, in embodiments where the logic circuit is provided with all connections made, certain of the connections may be laser-modified to be broken or removed. As another example, in embodiments where the logic circuit is provided with no connections made, the logic circuit may be laser modified to make certain connections.

At 310, an auxiliary component is added to the filmic circuit assembly. For example, a RFID antenna may be added. Alternatively or additionally, other auxiliary components may be added. In various embodiments, a RFID antenna may be registered to the logic circuit (e.g., a logic circuit formed and added to the filmic circuit assembly at 308), and placed or otherwise affixed to the filmic circuit assembly (e.g., affixed to a surface of the release coat or a releaseable carrier coating or layer). In other embodiments, an auxiliary component such as a RFID antenna that is registered to the logic circuit may be printed onto a surface of an upper coat or carrier layer. The auxiliary component may be printed, for example, via the digital transfer of conductive materials to a surface of an upper coat or carrier coat.

At 312, interconnecting traces are provided. The interconnecting traces may be provided similarly in respects to the providing of interconnecting traces discussed in connection with step 210 of method 200. For example, the interconnecting traces may be configured to connect a logic circuit to an auxiliary component so that the logic circuit and auxiliary component form a circuit. The interconnecting traces, for example, may be printed either as a fixed print or as a digital print, or, as another example, the interconnecting traces may be pre-supplied as part of the auxiliary component.

At 314, the logic circuit (or IC component) may be programmed. The programming may be performed similarly in respects to the programming discussed in connection with step 212 of the method 200. For example, the programming may be performed at a variety of times as discussed above. Further, the programming may assign one or more serial number, tracking number, or other identifier to one or more of a logic circuit, an auxiliary component associated with the logic circuit, a transferable film that incorporates, includes, or is otherwise associated with the logic circuit, or an object to which the logic circuit (or an associated transferable film) has been affixed.

At 316, the interconnects joining, coupling, or operatively connecting the logic circuit and the IC component (e.g., RFID antenna) may be affixed with a conductive adhesive or otherwise completed or finished. Such completing or finishing of interconnects may be performed, for example, similarly to the discussion in connection with step 214 of method 200. For example, such interconnects may be completed or finished at various times or places during the performance of methods in various embodiments.

At 318, an adhesive layer is added to the filmic circuit assembly. The addition of the adhesive layer may be similar in respects to the addition of the adhesive layer discussed in connection with the method 200 at step 216.

Figure 4:
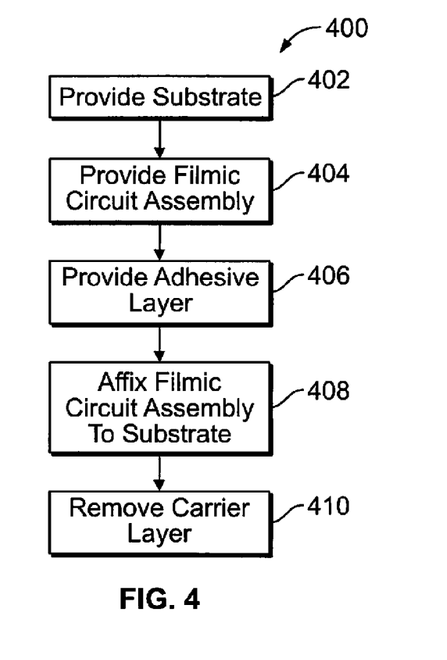
FIG. 4 is a flowchart of one embodiment of a method for applying a filmic circuit assembly to a substrate.
Figure 5:
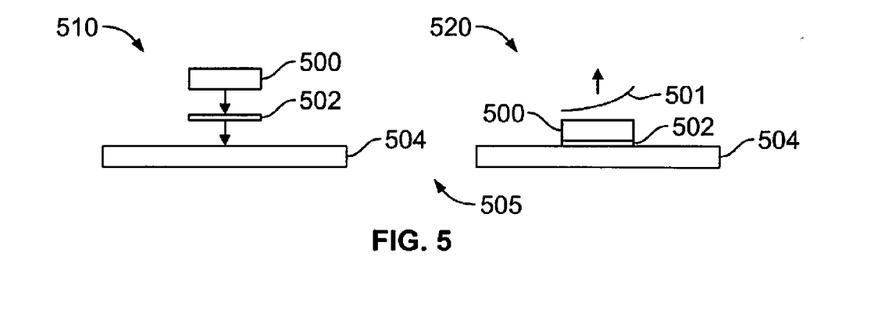
FIG. 5 is a schematic view of a substrate having a filmic circuit applied thereto in accordance with an embodiment.

FIG. 4 shows a flowchart of a method 400 for applying a filmic circuit assembly to a target, and FIG. 5 provides a schematic depiction of the application of a filmic circuit assembly 500 to a substrate 504. The method 400 may be used in conjunction with other embodiments discussed elsewhere herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

At 402, a substrate (e.g., target 112) is provided. In various embodiments, the substrate may be a film or a portion thereof. For example, the filmic circuit assembly may be incorporated into are added to a transferable film during the assembly or construction of the transferable film. For example, the filmic circuit assembly may be affixed to an adhesive layer of the transferable film configured to receive the filmic circuit assembly. The transferable film may include additional layers, portions, or functionality, such as graphics, and may be configured as a heat transferable film. In some embodiments, the transferable film may be configured as a hot stamping foil. Thus, the filmic circuit assembly may form one or more layers or portions of a heat transferable film that in turn may be applied to an object. In other embodiments, the filmic circuit assembly may not be incorporated into such a transferable film having additional layers and may instead be mounted or affixed directly to an object such as a product, package, envelope, or the like. In FIG. 5, a filmic circuit assembly 500 at a first stage 510 of a process 505 is depicted schematically in position to be applied to a target 504, with an adhesive layer 502 interposed between the filmic circuit assembly 500 and the substrate 504. In the embodiment depicted in FIG. 5, the substrate 504 may be, for example, a heat transferable film or a hot stamping foil to which the filmic circuit assembly 500 is being added or incorporated as a layer or portion thereof.

Returning to FIG. 4, at 404, a filmic circuit assembly (e.g., filmic circuit assembly 100) is provided. The filmic circuit assembly in various embodiments may include a logic circuit portion and a carrier layer. The filmic circuit assembly may be positioned for application to the substrate with the carrier layer oriented away from the substrate and the logic circuit portion oriented toward the substrate. In various embodiments, the filmic circuit assembly may be associated with the substrate. For example, information from the substrate and/or an object to which the substrate will be attached may be determined (e.g., identification information such as a serial number), and the information may be programmed into a corresponding filmic circuit assembly that will be attached to the substrate.

At 406, an adhesive layer is provided. The adhesive layer is configured to adhere the filmic circuit assembly to a target. In some embodiments the adhesive layer may be applied to one or more portions of the filmic circuit assembly, such as a logic circuit portion. The adhesive layer may be applied, for example, by coating a layer of adhesive over the logic circuit portion. Alternatively or additionally, an adhesive layer may be provided as a part of the substrate, or applied to the substrate prior to the application of the filmic logic circuit to the target. For example, a film or a foil being assembled or manufactured may have an adhesive layer configured to receive the filmic circuit assembly, and the filmic circuit assembly may be added to the film or foil by affixing the circuit portion of the filmic circuit assembly to the adhesive layer of the film or foil that is configured to receive the filmic circuit assembly. In still other embodiments, as depicted at stage 510 of FIG. 5, a separate adhesive layer may be supplied in an intermediate position between the filmic circuit assembly and the target when the filmic circuit assembly is positioned to be affixed to the target. For example, the adhesive layer and filmic circuit assembly may be provided via separate reels that are synchronized or otherwise coordinated to provide the filmic circuit assembly and adhesive layer in a coordinated fashion for being affixed to the substrate in conjunction with each other.

Returning to FIG. 4, at 408, the filmic circuit assembly is affixed to the substrate. Then, at 410, a carrier layer of the filmic circuit assembly is removed. The carrier layer may be released or removed from the filmic circuit assembly as part of a heat facilitated application process. In various embodiments, a filmic circuit assembly may have a release coat positioned proximate the carrier layer to facilitate the release or removal of the carrier layer after the filmic circuit assembly is applied to an object, and the release coat may be released or removed from the filmic circuit assembly at 410 as well. Removal of a carrier layer 501 from a filmic circuit assembly 500 that has been applied to a substrate 504 is depicted schematically at stage 520 of the process 505 depicted in FIG. 5.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While relative dimensions described herein are intended to define the parameters of the inventive subject matter, they are by no means limiting and are example embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. For example, methods (or portions thereof) disclosed herein for assembling, providing, and/or manufacturing a filmic circuit assembly (e.g., method 300, method 400) may be performed in conjunction with appropriately programmed computers or processors (e.g., in conjunction with a tangible, non-transitory computer readable medium including one or more software modules configured to direct a processor to perform one or more steps of a method of a given embodiment). Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

What is claimed is:

1. A method for providing a filmic circuit assembly, the method comprising:
   providing a carrier layer configured to be removed from the filmic circuit assembly after the filmic circuit assembly is applied to a target;
   adding an IC component directly to at least one of the carrier layer or an upper coat adjacent to the carrier layer, the IC component comprising plural logic gates configurable to receive an input and provide a corresponding logical output, the IC component configured to receive an adhesive layer configured to affix the filmic circuit assembly to a target; and
   adding an auxiliary component operably connected to the IC component to form a circuit portion.

2. The method of claim 1, wherein the auxiliary component comprises a radiofrequency identification (RFID) antenna, the method further comprising registering the RFID antenna to the IC component.

3. The method of claim 1, wherein the circuit portion comprises interconnecting conductive traces, and wherein the adding the circuit portion to the carrier layer comprises printing the interconnecting conductive traces to at least one of the carrier layer or a layer associated with the carrier layer.

4. The method of claim 1, further comprising programming the IC component.

5. The method of claim 4, further comprising applying the adhesive layer to the circuit portion after the programming of the IC component.

6. The method of claim 1, further comprising applying a release layer to the carrier layer, the release layer configured to be interposed between the IC component and the carrier layer, whereby adding the IC component comprises adding the IC component to the release layer after the release layer has been applied to the carrier layer, the release layer configured to facilitate release of the carrier layer from the IC component after the circuit assembly is affixed to the target.

7. The method of claim 6, further comprising planarizing the release layer before adding the IC component.

8. The method of claim 6, wherein the adding the IC component comprises forming the IC component by adding materials to the release layer after the applying of the release layer to the carrier layer.

\* \* \* \* \*